(12) United States Patent
Byun et al.

(10) Patent No.: US 6,831,004 B2
(45) Date of Patent: *Dec. 14, 2004

(54) FORMATION OF BORIDE BARRIER LAYERS USING CHEMISORPTION TECHNIQUES

(75) Inventors: Jeong Soo Byun, Cupertino, CA (US); Alfred Mak, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/387,990

(22) Filed: Mar. 13, 2003

(65) Prior Publication Data

US 2004/0018723 A1 Jan. 29, 2004

Related U.S. Application Data

(63) Continuation of application No. 09/604,943, filed on Jun. 27, 2000, now Pat. No. 6,620,723.

(51) Int. Cl.[7] .......................................... H01L 21/4763
(52) U.S. Cl. ....................................... 438/627; 438/628
(58) Field of Search ................................ 438/584, 627, 438/628

(56) References Cited

U.S. PATENT DOCUMENTS

| | | | |
|---|---|---|---|
| 4,389,973 A | 6/1983 | Suntola et al. | ............... 118/725 |
| 4,413,022 A | 11/1983 | Suntola et al. | ........... 427/255.2 |
| 4,486,487 A | 12/1984 | Skarp | ......................... 428/216 |
| 5,290,609 A | 3/1994 | Horiike et al. | .............. 427/576 |
| 5,306,666 A | 4/1994 | Izumi | ........................ 437/192 |
| 5,374,570 A | 12/1994 | Nasu et al. | .................... 437/40 |
| 5,526,244 A | 6/1996 | Bishop | ....................... 362/147 |
| 5,711,811 A | 1/1998 | Suntola et al. | .............. 118/711 |
| 5,804,488 A | 9/1998 | Shih et al. | |
| 5,916,365 A | 6/1999 | Sherman | ...................... 117/92 |
| 5,923,056 A | 7/1999 | Lee et al. | .................... 257/192 |

(List continued on next page.)

FOREIGN PATENT DOCUMENTS

| | | | |
|---|---|---|---|
| EP | 1 146 141 | 10/2001 | ........... C23C/16/40 |
| EP | 1 167 569 | 1/2002 | ......... C23C/16/455 |
| EP | 1 170 804 | 1/2002 | ........... H01L/29/94 |
| GB | 2 355 727 | 5/2001 | ........... C23C/16/44 |
| JP | 2246161 | 9/1999 | ........... C23C/16/40 |
| JP | 2000031387 | 1/2000 | ........... H01L/27/04 |
| JP | 2000058777 | 2/2000 | ......... H01L/27/108 |
| JP | 2001172767 | 6/2001 | ........... C23C/16/40 |
| JP | 2001220294 | 8/2001 | ........... C30B/29/20 |
| JP | 2001254181 | 9/2001 | ........... C23C/16/46 |

(List continued on next page.)

OTHER PUBLICATIONS

C.S. Cchoi et al., "The effect of annealing on resisivity of low pressure chemical vapor titanium diboride", Journal of Applied Physics, Jun. 1, 1991, pp. 7853–7861.*

Klaus, et al. "Atomically Controlled Growth of Tungsten and Tungsten Nitride Using Sequential Surface Reactions," Applied Surface Science, 162–163 (2000) 479–491.

(List continued on next page.)

*Primary Examiner*—W. David Coleman
(74) *Attorney, Agent, or Firm*—Moser Patterson & Sheridan

(57) ABSTRACT

A method of forming a boride layer for integrated circuit fabrication is disclosed. In one embodiment, the boride layer is formed by chemisorbing monolayers of a boron-containing compound and one refractory metal compound onto a substrate. In an alternate embodiment, the boride layer has a composite structure. The composite boride layer structure comprises two or more refractory metals. The composite boride layer is formed by sequentially chemisorbing monolayers of a boron compound and two or more refractory metal compounds on a substrate.

34 Claims, 7 Drawing Sheets

U.S. PATENT DOCUMENTS

| | | | |
|---|---|---|---|
| 6,013,553 A | 1/2000 | Wallace et al. | 438/287 |
| 6,015,590 A | 1/2000 | Suntola et al. | 427/255.23 |
| 6,015,917 A | 1/2000 | Bhandari et al. | 556/12 |
| 6,020,243 A | 2/2000 | Wallace et al. | 438/287 |
| 6,042,652 A | 3/2000 | Hynn et al. | 118/719 |
| 6,084,302 A | 7/2000 | Sandhu | 257/751 |
| 6,124,158 A | 9/2000 | Dautartas et al. | 438/216 |
| 6,139,700 A | 10/2000 | Kang et al. | 204/192.17 |
| 6,144,060 A | 11/2000 | Park et al. | 257/310 |
| 6,174,809 B1 | 1/2001 | Kang et al. | 438/682 |
| 6,197,683 B1 | 3/2001 | Kang et al. | 438/643 |
| 6,200,893 B1 | 3/2001 | Sneh | 438/685 |
| 6,203,613 B1 | 3/2001 | Gates et al. | 117/104 |
| 6,207,302 B1 | 3/2001 | Sugiura et al. | 428/690 |
| 6,207,487 B1 | 3/2001 | Kim et al. | 438/238 |
| 6,218,298 B1 | 4/2001 | Hoinkis | |
| 6,238,734 B1 | 5/2001 | Senzaki et al. | 427/226 |
| 6,270,572 B1 | 8/2001 | Kim et al. | 117/93 |
| 6,284,646 B1 | 9/2001 | Leem | 438/629 |
| 6,287,965 B1 | 9/2001 | Kang et al. | 438/648 |
| 6,291,283 B1 | 9/2001 | Wilk | 438/216 |
| 6,297,539 B1 | 10/2001 | Ma et al. | 257/410 |
| 6,299,294 B1 | 10/2001 | Regan | 347/762 |
| 6,305,314 B1 | 10/2001 | Sneh et al. | 118/723 R |
| 6,333,260 B1 | 12/2001 | Kwon et al. | 438/643 |
| 6,335,280 B1 | 1/2002 | van der Jeugd | |
| 6,342,277 B1 | 1/2002 | Sherman | 427/562 |
| 6,348,376 B2 | 2/2002 | Lim et al. | 438/253 |
| 6,348,386 B1 | 2/2002 | Gilmer | 438/288 |
| 6,355,561 B1 | 3/2002 | Sandhu et al. | 438/676 |
| 6,358,829 B2 | 3/2002 | Yoon et al. | 438/597 |
| 6,368,954 B1 | 4/2002 | Lopatin et al. | 438/627 |
| 6,369,430 B1 | 4/2002 | Adetutu et al. | 257/382 |
| 6,372,598 B2 | 4/2002 | Kang et al. | 438/399 |
| 6,379,748 B1 | 4/2002 | Bhandari et al. | 427/255.394 |
| 6,391,785 B1 | 5/2002 | Satta et al. | 438/704 |
| 6,391,803 B1 | 5/2002 | Kim et al. | 438/787 |
| 6,395,650 B1 | 5/2002 | Callegari et al. | 438/785 |
| 6,399,491 B2 | 6/2002 | Jeon et al. | 438/680 |
| 6,416,577 B1 | 7/2002 | Suntoloa et al. | 117/88 |
| 6,420,189 B1 | 7/2002 | Lopatin | 438/2 |
| 6,420,279 B1 | 7/2002 | Ono et al. | 438/785 |
| 6,423,619 B1 | 7/2002 | Grant et al. | 438/589 |
| 6,447,933 B1 | 9/2002 | Wang et al. | 428/635 |
| 6,451,119 B2 | 9/2002 | Sneh et al. | 118/715 |
| 6,451,695 B2 | 9/2002 | Sneh | 438/685 |
| 6,452,229 B1 | 9/2002 | Krivokapic | 257/330 |
| 6,458,701 B1 | 10/2002 | Chae et al. | 438/680 |
| 6,468,924 B2 | 10/2002 | Lee et al. | 438/763 |
| 6,475,276 B1 | 11/2002 | Elers et al. | 117/84 |
| 6,475,910 B1 | 11/2002 | Sneh | 438/685 |
| 6,478,872 B1 | 11/2002 | Chae et al. | |
| 6,482,262 B1 | 11/2002 | Elers et al. | 117/84 |
| 6,482,733 B2 | 11/2002 | Raaijmakers et al. | 438/633 |
| 6,482,740 B2 | 11/2002 | Soininen et al. | 438/686 |
| 6,511,539 B1 | 1/2003 | Raaijmakers | 117/102 |
| 6,534,395 B2 | 3/2003 | Werkhoven et al. | 438/627 |
| 6,548,424 B2 | 4/2003 | Putkonen | 438/785 |
| 6,551,929 B1 | 4/2003 | Kori et al. | |
| 6,569,501 B2 | 5/2003 | Chiang et al. | |
| 6,585,823 B1 | 7/2003 | Van Wijck | |
| 6,599,572 B2 | 7/2003 | Saanila et al. | |
| 6,607,976 B2 | 8/2003 | Chen et al. | |
| 6,620,723 B1 | 9/2003 | Byun et al. | |
| 6,630,201 B2 | 10/2003 | Chiang et al. | |
| 6,632,279 B1 | 10/2003 | Ritala et al. | |
| 6,660,126 B2 | 12/2003 | Nguyen et al. | |
| 6,686,271 B2 | 2/2004 | Raaijmakers et al. | |
| 2001/0000866 A1 | 5/2001 | Sneh et al. | 118/723 |
| 2001/0002280 A1 | 5/2001 | Sneh | 427/255.28 |
| 2001/0009140 A1 | 7/2001 | Bondestam et al. | 118/725 |
| 2001/0009695 A1 | 7/2001 | Saanila et al. | 427/255.39 |
| 2001/0021589 A1 | 9/2001 | Wilk | 438/778 |
| 2001/0024387 A1 | 9/2001 | Raaijmakers et al. | 365/200 |
| 2001/0025979 A1 | 10/2001 | Kim et al. | 257/315 |
| 2001/0028924 A1 | 10/2001 | Sherman | 427/255.28 |
| 2001/0029094 A1 | 10/2001 | Mee-Young et al. | 438/597 |
| 2001/0029891 A1 | 10/2001 | Oh et al. | 118/722 |
| 2001/0034123 A1 | 10/2001 | Jeon et al. | 438/643 |
| 2001/0041250 A1 | 11/2001 | Werkhoven et al. | 428/212 |
| 2001/0050039 A1 | 12/2001 | Park | 117/102 |
| 2001/0054730 A1 | 12/2001 | Kim et al. | 257/301 |
| 2001/0054769 A1 | 12/2001 | Raaijmakers et al. | 257/758 |
| 2002/0000598 A1 | 1/2002 | Kang et al. | 257/301 |
| 2002/0004293 A1 | 1/2002 | Soininen et al. | 438/584 |
| 2002/0005556 A1 | 1/2002 | Cartier et al. | 257/381 |
| 2002/0007790 A1 | 1/2002 | Park | 118/715 |
| 2002/0008297 A1 | 1/2002 | Park et al. | 257/510 |
| 2002/0014647 A1 | 2/2002 | Seidl et al. | 257/301 |
| 2002/0015790 A1 | 2/2002 | Baum et al. | 427/255.28 |
| 2002/0019121 A1 | 2/2002 | Pyo | 438/618 |
| 2002/0020869 A1 | 2/2002 | Park et al. | 257/306 |
| 2002/0021544 A1 | 2/2002 | Cho et al. | 361/200 |
| 2002/0029092 A1 | 3/2002 | Gass | 700/116 |
| 2002/0031618 A1 | 3/2002 | Sherman | 427/569 |
| 2002/0037630 A1 | 3/2002 | Agarwal et al. | 438/430 |
| 2002/0041931 A1 | 4/2002 | Suntola et al. | 427/255.28 |
| 2002/0043666 A1 | 4/2002 | Parson et al. | 257/200 |
| 2002/0048635 A1 | 4/2002 | Kim et al. | 427/331 |
| 2002/0048880 A1 | 4/2002 | Lee | 438/253 |
| 2002/0052097 A1 | 5/2002 | Park | 438/507 |
| 2002/0055235 A1 | 5/2002 | Agarwal et al. | 438/430 |
| 2002/0061612 A1 | 5/2002 | Sandhu et al. | 438/151 |
| 2002/0064970 A1 | 5/2002 | Chooi et al. | 438/785 |
| 2002/0074588 A1 | 6/2002 | Lee | 257/306 |
| 2002/0076507 A1 | 6/2002 | Chiang et al. | 427/569 |
| 2002/0076837 A1 | 6/2002 | Hujanen et al. | 438/3 |
| 2002/0081826 A1 | 6/2002 | Rotondaro et al. | 438/585 |
| 2002/0081844 A1 | 6/2002 | Jeon et al. | 438/680 |
| 2002/0086111 A1 | 7/2002 | Byun et al. | |
| 2002/0090829 A1 | 7/2002 | Sandhu et al. | 438/761 |
| 2002/0093046 A1 | 7/2002 | Moriya et al. | 257/315 |
| 2002/0093781 A1 | 7/2002 | Bechhofer et al. | 361/312 |
| 2002/0094689 A1 | 7/2002 | Park | 438/694 |
| 2002/0098627 A1 | 7/2002 | Pomarede et al. | 438/149 |
| 2002/0105088 A1 | 8/2002 | Yang et al. | 257/774 |
| 2002/0106536 A1 | 8/2002 | Lee et al. | 428/702 |
| 2002/0106846 A1 | 8/2002 | Seutter et al. | 438/200 |
| 2002/0109168 A1 | 8/2002 | Kim et al. | 257/295 |
| 2002/0117399 A1 | 8/2002 | Chen et al. | 205/125 |
| 2002/0121241 A1 | 9/2002 | Nguyen et al. | |
| 2002/0121342 A1 | 9/2002 | Nguyen et al. | |
| 2002/0121697 A1 | 9/2002 | Marsh et al. | 257/751 |
| 2002/0135071 A1 | 9/2002 | Kang et al. | 257/767 |
| 2002/0146895 A1 | 10/2002 | Ramdani et al. | 438/497 |
| 2002/0151152 A1 | 10/2002 | Shimamoto et al. | 438/398 |
| 2002/0153579 A1 | 10/2002 | Yamamoto | 257/412 |
| 2002/0155722 A1 | 10/2002 | Satta et al. | 438/704 |
| 2002/0162506 A1 | 11/2002 | Sneh et al. | 118/715 |
| 2002/0172768 A1 | 11/2002 | Endo et al. | |
| 2002/0175393 A1 | 11/2002 | Baum et al. | |
| 2002/0177282 A1 | 11/2002 | Song | 438/300 |
| 2002/0182320 A1 | 12/2002 | Leskela et al. | 427/250 |
| 2002/0187256 A1 | 12/2002 | Elers et al. | 427/99 |
| 2002/0187631 A1 | 12/2002 | Kim et al. | 438/637 |
| 2002/0197863 A1 | 12/2002 | Mak et al. | |
| 2002/0197881 A1 | 12/2002 | Ramdani et al. | |
| 2003/0013300 A1 | 1/2003 | Byun | |
| 2003/0013320 A1 | 1/2003 | Kim et al. | 438/778 |
| 2003/0031807 A1 | 2/2003 | Elers et al. | 427/569 |
| 2003/0032281 A1 | 2/2003 | Werkhoven et al. | 438/640 |

| | | |
|---|---|---|
| 2003/0049931 A1 | 3/2003 | Byun et al. |
| 2003/0049942 A1 | 3/2003 | Haukka et al. ............. 438/778 |
| 2003/0053799 A1 | 3/2003 | Lel |
| 2003/0054631 A1 | 3/2003 | Raaijmakers et al. |
| 2003/0057526 A1 | 3/2003 | Chung et al. |
| 2003/0057527 A1 | 3/2003 | Chung et al. |
| 2003/0059538 A1 | 3/2003 | Chung et al. |
| 2003/0072884 A1 | 4/2003 | Zhang et al. |
| 2003/0072975 A1 | 4/2003 | Shero et al. ................ 428/704 |
| 2003/0079686 A1 | 5/2003 | Chen et al. |
| 2003/0082296 A1 | 5/2003 | Elers et al. .................... 427/96 |
| 2003/0082300 A1 | 5/2003 | Todd et al. ............ 427/255.27 |
| 2003/0082301 A1 | 5/2003 | Chen et al. |
| 2003/0082307 A1 | 5/2003 | Chung et al. |
| 2003/0089308 A1 | 5/2003 | Raaijmakers et al. |
| 2003/0089942 A1 | 5/2003 | Bhattacharyya |
| 2003/0101927 A1 | 6/2003 | Raaijmakers |
| 2003/0104126 A1 | 6/2003 | Fang et al. |
| 2003/0104710 A1 | 6/2003 | Visokay et al. |
| 2003/0106490 A1 | 6/2003 | Jallepally et al. |
| 2003/0108674 A1 | 6/2003 | Chung et al. |
| 2003/0109114 A1 | 6/2003 | Niwa |
| 2003/0113187 A1 | 6/2003 | Lel et al. |
| 2003/0116087 A1 | 6/2003 | Nguyen et al. |
| 2003/0116804 A1 | 6/2003 | Visokay et al. |
| 2003/0121608 A1 | 7/2003 | Chen et al. |
| 2003/0123216 A1 | 7/2003 | Yoon et al. |
| 2003/0124262 A1 | 7/2003 | Chen et al. |
| 2003/0129826 A1 | 7/2003 | Werkhoven et al. |
| 2003/0134508 A1 | 7/2003 | Raaijamakers et al. |
| 2003/0143328 A1 | 7/2003 | Chen et al. |
| 2003/0143839 A1 | 7/2003 | Raaijmakers et al. |
| 2003/0143841 A1 | 7/2003 | Yang et al. |
| 2003/0153181 A1 | 8/2003 | Yoon et al. |
| 2003/0160277 A1 | 8/2003 | Bhattacharyya |
| 2003/0161952 A1 | 8/2003 | Wang et al. |
| 2003/0165615 A1 | 9/2003 | Aaltonen et al. |
| 2003/0168750 A1 | 9/2003 | Basceri et al. |
| 2003/0173586 A1 | 9/2003 | Moriwaki et al. |
| 2003/0185980 A1 | 10/2003 | Endo |
| 2003/0186495 A1 | 10/2003 | Saanlla et al. |
| 2003/0188682 A1 | 10/2003 | Tols et al. |
| 2003/0190423 A1 | 10/2003 | Yang et al. |
| 2003/0190497 A1 | 10/2003 | Yang et al. |
| 2003/0190804 A1 | 10/2003 | Glenn et al. |
| 2003/0194493 A1 | 10/2003 | Chang et al. |
| 2003/0194825 A1 | 10/2003 | Law et al. |
| 2003/0194853 A1 | 10/2003 | Jeon |
| 2003/0203616 A1 | 10/2003 | Chang et al. |
| 2003/0205729 A1 | 11/2003 | Basceri et al. |
| 2003/0213987 A1 | 11/2003 | Basceri et al. |
| 2003/0224217 A1 | 12/2003 | Byun et al. |
| 2003/0224578 A1 | 12/2003 | Chung et al. |
| 2003/0224600 A1 | 12/2003 | Cao et al. |
| 2003/0227033 A1 | 12/2003 | Ahn et al. |
| 2003/0232501 A1 | 12/2003 | Kher et al. |
| 2003/0232506 A1 | 12/2003 | Metzner et al. |
| 2003/0232511 A1 | 12/2003 | Metzner et al. |
| 2003/0234417 A1 | 12/2003 | Raaijmakers et al. |
| 2003/0235961 A1 | 12/2003 | Metzner et al. |
| 2004/0007747 A1 | 1/2004 | Visokay et al. |
| 2004/0009307 A1 | 1/2004 | Koh et al. |
| 2004/0009675 A1 | 1/2004 | Eissa et al. |
| 2004/0011504 A1 | 1/2004 | Ku et al. |
| 2004/0013577 A1 | 1/2004 | Ganguli et al. |
| 2004/0013803 A1 | 1/2004 | Chung et al. |
| 2004/0014315 A1 | 1/2004 | Lai et al. |
| 2004/0014320 A1 | 1/2004 | Chen et al. |
| 2004/0015300 A1 | 1/2004 | Ganguli et al. |
| 2004/0016973 A1 | 1/2004 | Rotondaro et al. |
| 2004/0018304 A1 | 1/2004 | Chung et al. |
| 2004/0018723 A1 | 1/2004 | Gross et al. |
| 2004/0018747 A1 | 1/2004 | Byun et al. |
| 2004/0023461 A1 | 2/2004 | Ahn et al. |
| 2004/0023462 A1 | 2/2004 | Rotondaro et al. |
| 2004/0028952 A1 | 2/2004 | Cartier et al. |
| 2004/0029321 A1 | 2/2004 | Ang et al. |
| 2004/0033698 A1 | 2/2004 | Lee et al. |
| 2004/0036111 A1 | 2/2004 | Nishikawa et al. |
| 2004/0038554 A1 | 2/2004 | Ahn et al. |
| 2004/0040501 A1 | 3/2004 | Vaartstra |
| 2004/0043149 A1 | 3/2004 | Gordon et al. |
| 2004/0043569 A1 | 3/2004 | Ahn et al. |
| 2004/0043630 A1 | 3/2004 | Vaarstra et al. |
| 2004/0046197 A1 | 3/2004 | Basceri et al. |
| 2004/0048491 A1 | 3/2004 | Jung et al. |
| 2004/0051152 A1 | 3/2004 | Nakajima |
| 2004/0053484 A1 | 3/2004 | Kumar et al. |
| 2004/0078723 A1 | 4/2004 | Gross et al. |

FOREIGN PATENT DOCUMENTS

| | | | |
|---|---|---|---|
| JP | 2002060944 | 2/2002 | ............ C23C/16/30 |
| JP | 2002-69641 | 3/2002 | ............ C23C/16/18 |
| JP | 2002-93804 | 3/2002 | ......... H01L/21/316 |
| JP | 2002-167672 | 6/2002 | ............ C23C/16/18 |
| JP | 2002-172767 | 6/2002 | .............. B41J/2/01 |
| JP | 2001111000 | 12/2002 | ............ H01L/29/00 |
| WO | 96/17107 | 6/1996 | ............ C23C/16/44 |
| WO | 98/51838 | 11/1998 | ............ C23C/16/06 |
| WO | 99/01595 | 1/1999 | ............ C30B/25/14 |
| WO | 99/29924 | 6/1999 | ............ C23C/16/04 |
| WO | 99/65064 | 12/1999 | ............ H01L/21/00 |
| WO | 00/15865 | 3/2000 | ............ C23C/16/00 |
| WO | 00/16377 | 3/2000 | |
| WO | 00/54320 | 9/2000 | ............ H01L/21/44 |
| WO | 00/63957 | 10/2000 | ......... H01L/21/205 |
| WO | 00/70674 | 11/2000 | ....... H01L/21/8242 |
| WO | 00/79576 | 12/2000 | ......... H01L/21/205 |
| WO | 01/15220 | 3/2001 | ......... H01L/21/768 |
| WO | 01/17692 | 3/2001 | ............ B05C/11/00 |
| WO | 01/25502 | 4/2001 | ............ C23C/16/18 |
| WO | 01/27346 | 4/2001 | ............ C23C/16/44 |
| WO | 01/27347 | 4/2001 | ............ C23C/16/44 |
| WO | 01/29280 | 4/2001 | ............ C23C/16/32 |
| WO | 01/29891 | 4/2001 | ......... H01L/21/768 |
| WO | 01/29893 | 4/2001 | ......... H01L/21/768 |
| WO | 01/36702 | 5/2001 | ............ C23C/16/00 |
| WO | 01/40541 | 6/2001 | ............ C23C/16/40 |
| WO | 01/66832 | 9/2001 | ............ C30B/25/14 |
| WO | 01/82390 | 11/2001 | ............ H01L/51/20 |
| WO | WO 02/01628 A2 | 1/2002 | |
| WO | 02/08485 | 1/2002 | ............ C23C/16/00 |
| WO | 02/09167 | 1/2002 | ......... H01L/21/316 |
| WO | 02/27063 | 4/2002 | ............ C23C/16/40 |
| WO | 02/43115 | 5/2002 | |
| WO | 02/45167 | 6/2002 | ............ H01L/27/00 |
| WO | WO 02/45871 A1 | 6/2002 | |
| WO | 02/067319 | 8/2002 | ......... H01L/21/768 |

OTHER PUBLICATIONS

Sneh, et al. "Atomic Layer Deposition of $SiO_2$ Using Catalyzed and Uncatalyzed Self–Limiting Surface Reactions," Surface Review and Letters, vol. 6, Nos. 3 & 4 (1999) 435–448.

Rossnagel, et al. "Plasma–enhanced Atomic Layer Depositon of Ta and Ti for Interconnect Diffusion Barriers," J. Vacuum Sci & Tech. B., vol. 18, No. 4 (Jul. 2000), pp. 2016–2020.

Ritala, et al. "Perfectly Conformal TiN and $Al_2O_3$ Films Deposited by Atmoic Layer Deposition," Chem. Vap. Deposition 1999, 5, No. 1.

Ritala, et al. "Atomic Layer Epitaxy Growth of TiN Thin Films," J. Electrochem. Soc., vol. 142, No. 8, Aug. 1995.

Ritala, et al. "Surface Roughness Reductin in Atomic Layer Epitaxy Growth of Titanium Dioxide Thin Films," Thin Solid–Films, vol. 249, No. 2 (Sep. 15, 1994), pp. 155–162.

Ritala, et al. "Atomic Force Microscopy Study of Titanium Dioxide Thin Films Grown by Atomic Layer Epitaxy," Thin Solid Films, vol. 228, No. 1–2 (May 15, 1993), pp. 32–35.

Ritala, et al. "Growth of Titanium Dioxide Thin Films by Atomic Layer Epitaxy," Thin Solid Films, vol. 225, No. 1–2 (Mar. 25, 1993) pp. 288–295.

Ritala, et al. "Effects of Intermediate Zinc Pulses on Properties of TiN and NbN Films by Atomic Layer Epitaxy," Applied Surface Science, vol. 120, No. 3–4, (Dec.1997), pp. 199–212.

Ritala, et al. "Atomic Layer Epitaxy Growth of TiN Thin Films From $TiI_4$ and $NH_3$," J. Electrochem. Soc., vol. 145, No. 8 (Aug., 1998) pp. 2914–2920.

Martensson, et al. "Use of Atomic Layer Epitaxy for Fabrication of Si/TiN/Cu Structures," J. Vac. Sci. & Tech. B, vol. 17, No. 5, (Sep. 1999) pp. 2122–2128.

Proceedings of the ICEEE 1998 International Interconnect Technology Conference—San Francisco, California, Jun. 1–3, 1998.

Niinisto, et al. "Synthesis of Oxide Thin Films and Overlayers by Atomic Layer Epitaxy for Advanced Applications," Materials Science and Engineering B41 (1996) 23–29.

Min, et al. "Metal–organic Atomic–layer Deposition of Titanium–silicon–nitride films," Applied Physics Letters, vol. 75, No. 11 (Sep. 13, 1999).

Min, et al. "Chemical Vapor Deposition of Ti–Si–N Films With Alternating Source Supply," Mat. Rec. Soc. Symp. Proc. vol. (1999).

Min, et al. "Atomic Layer Deposition of TiN Thin Films by Sequential Introduction of Ti Precursor and NH3," Mat. Res. Soc. Symp. Proc. vol. 514 (1998).

George, et al. "Surface Chemistry for Atomic Layer Growth," J. Phys. Chem. 1996, 100, 13121–13131.

Kukli, et al., "Tailoring the Dielectric Properties of $HfO_2$–$Ta_2$–$O_5$ Nanolaminates," Applied Physics Letters, vol. 68, No. 26, Jun. 24, 1996; pp. 3737–9.

Kukli, et al. "Atomic Layer Epitaxy Growth of Tantalum Oxide Thin Films from $Ta(OC_2H_5)_5$ and $H_2O$," Journal of the Electrochemical Society, vol. 142, No. 5, May 1995; pp. 1670–5.

Kukli, et al., "*In situ* Study of Atomic Layer Epitaxy Growth of Tantalum Oxide Thin Films From $Ta(OC_2H_5)_5$ and $H_2O$," Applied Surface Science, vol. 112, Mar. 1997, pp. 236–42.

Kukli, et al., "Properties of $Ta_2O_5$–Based Dielectric Nanolaminates Deposited by Atomic Layer Epitaxy," Journal of the Electrochemical Society, vol. 144, No. 1, Jan. 1997; pp. 300–6.

Kukli, et al., "Properties of $[Nb_{1-x}Ta_x]_2O_5$ Solid Solutions and $[Nb_{1-x}Ta_x]_2O_5$–$ZrO_2$ Nanolaminates Grown by Atomic Layer Epitaxy," 1997; pp. 785–93.

Ritala, M., et al., "Chemical Vapor Deposition," Jan. 1999, pp. 6–9.

Eisenbraum, et al. "Atomic Layer Deposition (ALD) of Tantalum–based materials for zero thickness copper barrier applications," Proceedings of the IEEE 2001 International Interconnect Technology Conference (Cat. No. 01EX461)2001.

Hendrix, et al., "Composition Control of $Hf_{1-x}Si_xO_2$ Films Deposited on Si by Chemical–vapor Deposition Using Amide Precursors," Applied Physics Letters, vol. 80, No. 13 (Apr. 1, 2002).

Cheon, et al. "Gas Phase Photoproduction of Diatomic Metal Nitrides During Metal Nitride Laser Chemical Vapor Deposition," Inorg. Chem. 1999, 38, 2238–2239.

Ohshita, et al. "$HfO_2$ Growth by Low–pressure Chemical Vapor Deposition Using the $Hf(N(C_2H_5)_2)_4/O_2$ Gas System," Journal of Crystal Growth 233 (2001) 292–297.

Balog, et al. "Chemical Vapor Deposition and Characterization of $HfO_2$ Films from Organo–Hafnium Compounds," Thin Solid Films, 41 (1977) 247–259.

Ritala, et al. Ann. Acad. Sci. Fenn. Ser. A II. Chemica 257 (1994) 1–48.

Kattelus, et al. Electrical Properties of Tantalum Based Composite Oxide Films, Mat. Res. Soc. Symp. Proc., 284 (1993) 511–516.

Ritala, et al., "Development of Crystallinity and Morphology in Hafnium Dioxide Thin Films Grown by Atomic Layer Epitaxy," Thin Solid Films, vol. 250, No. 1–2, (Oct. 1, 1994), pp. 72–80.

* cited by examiner

FORMATION OF BORIDE BARRIER LAYERS USING CHEMISORPTION TECHNIQUES

CROSS-REFERENCE TO RELATED APPLICATIONS

This application is a continuation of U.S. patent application Ser. No. 09/604,943, filed Jun. 27, 2000, now U.S. Pat. No. 6,620,723 which is herein incorporated by reference.

BACKGROUND OF THE INVENTION

1. Field of the Invention

The present invention relates to the formation of boride barrier layers and, more particularly to boride barrier layers formed using chemisorption techniques.

2. Description of the Related Art

In the manufacture of integrated circuits, barrier layers are often used to inhibit the diffusion of metals and other impurities into regions underlying such barrier layers. These underlying regions may include transistor gates, capacitor dielectric, semiconductor substrates, metal lines, as well as many other structures that appear in integrated circuits.

For the current subhalf-micron (0.5 $\mu$m) generation of semiconductor devices, any microscopic reaction at an interface between interconnection layers can cause degradation of the resulting integrated circuits (e. g., increase the resistivity of the interconnection layers). Consequently, barrier layers have become a critical component for improving the reliability of interconnect metallization schemes.

Compounds of refractory metals such as, for example, nitrides, borides, and carbides have been suggested as diffusion barriers because of their chemical inertness and low resistivities (e. g., resistivities typically less than about 200 $\mu\Omega$-cm). In particular, borides such as, for example, titanium diboride ($TiB_2$) have been suggested for use as a barrier material since layers formed thereof generally have low resistivities (e. g., resistivities less than about 150 $\mu\Omega$-cm).

Boride barrier layers are typically formed using chemical vapor deposition (CVD) techniques. For example, titanium tetrachloride ($TiCl_4$) may be reacted with diborane ($B_2H_6$) to form titanium diboride ($TiB_2$) using CVD. However, when Cl-based chemistries are used to form boride barrier layers, reliability problems can occur. In particular, boride layers formed using CVD chlorine-based chemistries typically have a high chlorine (Cl) content (e. g., chlorine content greater than about 3%). A high chlorine content is undesirable because the chlorine may migrate from the boride barrier layer into adjacent interconnection layers, which can increase the contact resistance of such interconnection layers and potentially change the characteristics of integrated circuits made therefrom.

Therefore, a need exists in the art for reliable boride barrier layers for integrated circuit fabrication. Particularly desirable would be reliable boride barrier layers useful for interconnect structures.

SUMMARY OF THE INVENTION

Boride barrier layers for integrated circuit fabrication are provided. In one embodiment, the boride barrier layer comprises one refractory metal. The boride barrier layer may be formed by sequentially chemisorbing alternating monolayers of a boron compound and a refractory metal compound onto a substrate.

In an alternate embodiment, a composite boride barrier layer is formed. The composite boride barrier layer comprises two or more refractory metals. The composite boride barrier layer may be formed by sequentially chemisorbing monolayers of a boron compound and two or more refractory metal compounds onto a substrate.

The boride barrier layer is compatible with integrated circuit fabrication processes. In one integrated circuit fabrication process, the boride barrier layer comprises one refractory metal. The boride barrier layer is formed by sequentially chemisorbing alternating monolayers of a boron compound and one refractory metal compound on a substrate. Thereafter, one or more metal layers are deposited on the boride barrier layer to form an interconnect structure.

In another integrated circuit fabrication process, the boride barrier layer has a composite structure. The composite boride barrier layer comprises two or more refractory metals. The composite boride barrier layer is formed by sequentially chemisorbing monolayers of a boron compound and two or more refractory metal compounds on a substrate. Thereafter, one or more metal layers are deposited on the composite boride barrier layer to form an interconnect structure.

BRIEF DESCRIPTION OF THE DRAWINGS

The teachings of the present invention can be readily understood by considering the following detailed description in conjunction with the accompanying drawings, in which.

DETAILED DESCRIPTION OF THE PREFERRED EMBODIMENTS

Figure 1:
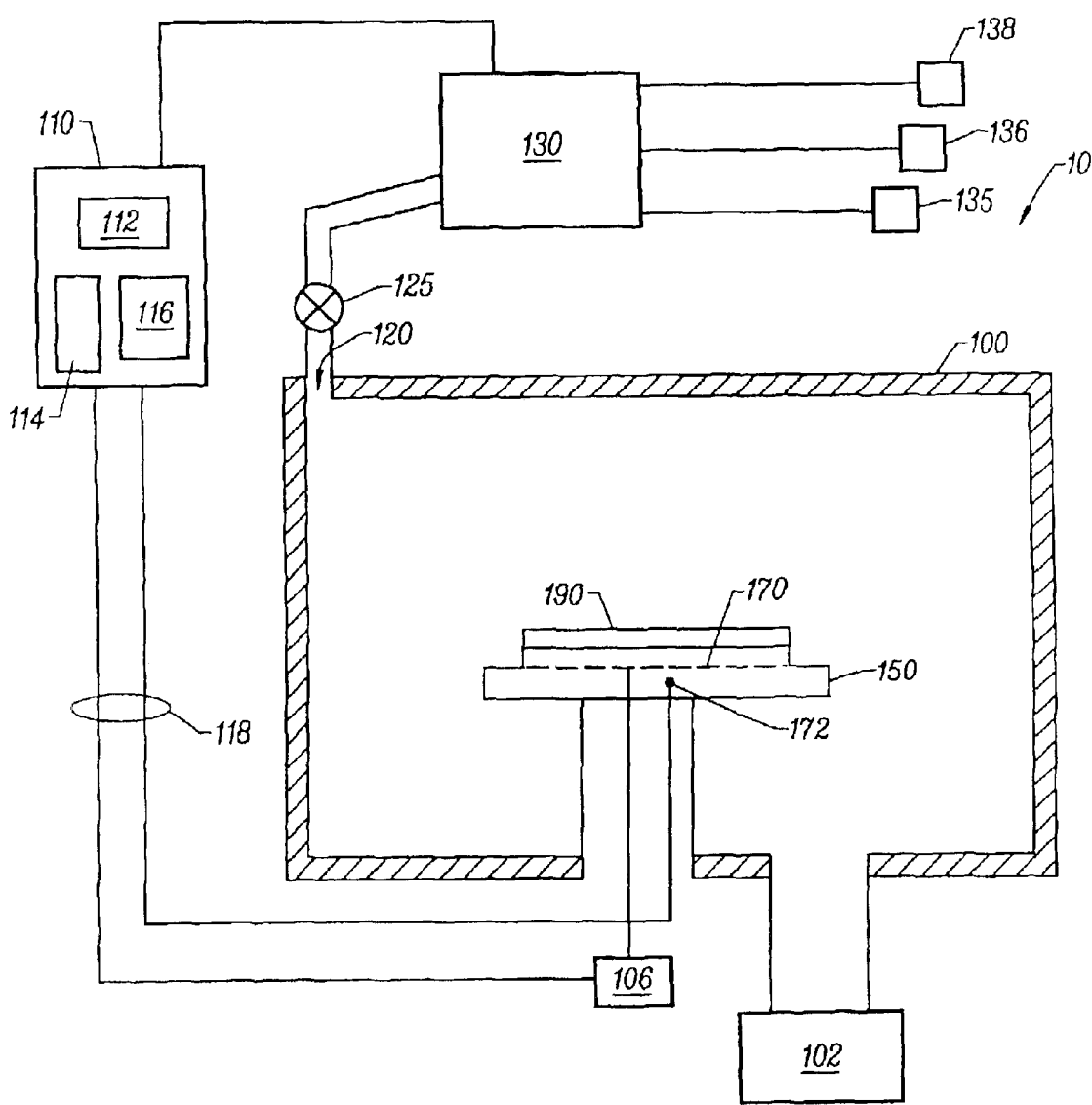
FIG. 1 depicts a schematic illustration of an apparatus that can be used for the practice of embodiments described herein.

FIG. 1 depicts a schematic illustration of a wafer processing system 10 that can be used to form boride barrier layers in accordance with embodiments described herein. The system 10 comprises a process chamber 100, a gas panel 130, a control unit 110, along with other hardware components such as power supplies 106 and vacuum pumps 102. The salient features of process chamber 100 are briefly described below.

Chamber 100

The process chamber 100 generally houses a support pedestal 150, which is used to support a substrate such as a semiconductor wafer 190 within the process chamber 100. Depending on the specific process, the semiconductor wafer 190 can be heated to some desired temperature prior to layer formation.

In chamber 100, the wafer support pedestal 150 is heated by an embedded heater 170. For example, the pedestal 150 may be resistively heated by applying an electric current from an AC power supply 106 to the heater element 170. The wafer 190 is, in turn, heated by the pedestal 150, and can be maintained within a desired process temperature range of, for example, about 20° C. to about 500° C.

A temperature sensor 172, such as a thermocouple, is also embedded in the wafer support pedestal 150 to monitor the temperature of the pedestal 150 in a conventional manner. For example, the measured temperature may be used in a feedback loop to control the electric current applied to the heater element 170 by the power supply 106, such that the wafer temperature can be maintained or controlled at a desired temperature that is suitable for the particular process application. The pedestal 150 is optionally, heated using radiant heat (not shown).

A vacuum pump 102 is used to evacuate process gases from the process chamber 100 and to help maintain the desired pressure inside the chamber 100. An orifice 120 is used to introduce process gases into the process chamber 100. The dimensions of the orifice 120 are variable and typically depend on the size of the process chamber 100.

The orifice 120 is coupled to a gas panel 130 via a valve 125. The gas panel 130 provides process gases from two or more gas sources 135, 136 to the process chamber 100 through orifice 120 and valve 125. The gas panel 130 also provides a purge gas from a purge gas source 138 to the process chamber 100 through orifice 120 and valve 125.

A control unit 110, such as a computer, controls the flow of various process gases through the gas panel 130 as well as valve 125 during the different steps of a wafer process sequence. Illustratively, the control unit 110 comprises a central processing unit (CPU) 112, support circuitry 114, and memories containing associated control software 116. In addition to the control of process gases through the gas panel 130, the control unit 110 is also responsible for automated control of the numerous steps required for wafer processing—such as wafer transport, temperature control, chamber evacuation, among other steps.

The control unit 110 may be one of any form of general purpose computer processor that can be used in an industrial setting for controlling various chambers and sub-processors. The computer processor may use any suitable memory, such as random access memory, read only memory, floppy disk drive, hard disk, or any other form of digital storage, local or remote. Various support circuits may be coupled to the computer processor for supporting the processor in a conventional manner. Software routines as required may be stored in the memory or executed by a second processor that is remotely located. Bi-directional communications between the control unit 110 and the various components of the wafer processing system 10 are handled through numerous signal cables collectively referred to as signal buses 118, some of which are illustrated in FIG. 1.

Boride Barrier Layer Formation

Figure 2A:
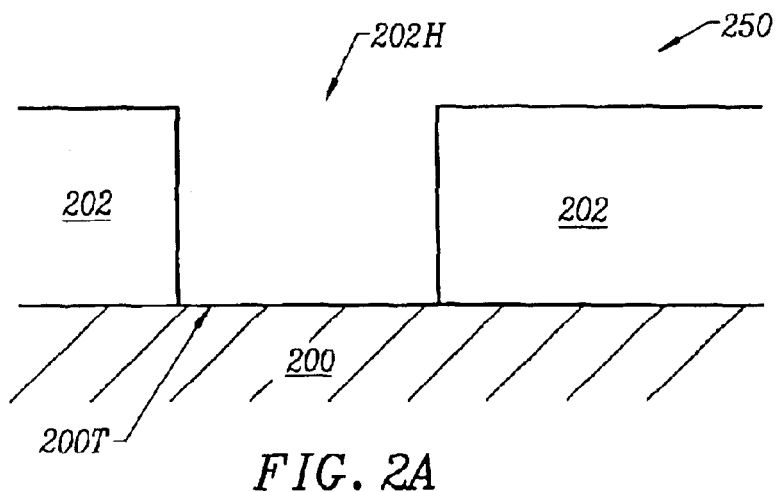
FIGS. 2a–2c depict cross-sectional views of a substrate structure at different stages of integrated circuit fabrication incorporating a boride barrier layer.
Figure 2B:
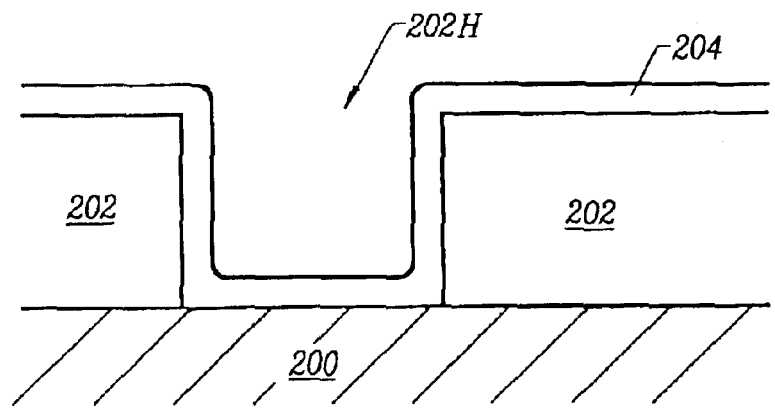
Figure 2C:
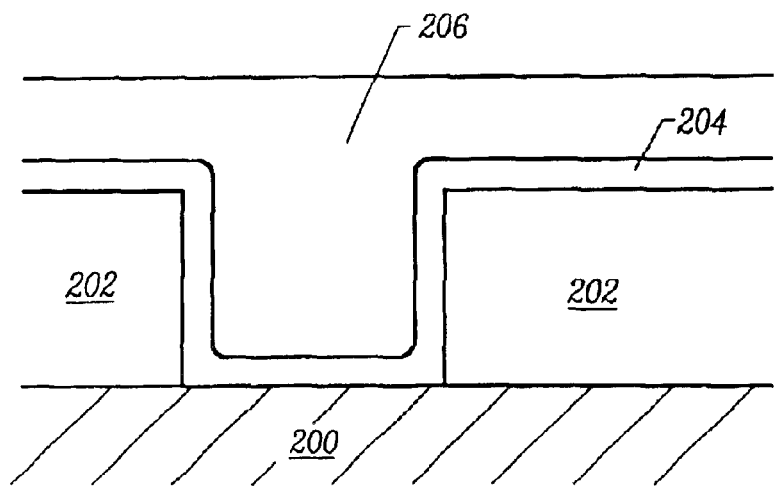

FIGS. 2a–2c illustrate one preferred embodiment of boride layer formation for integrated circuit fabrication of an interconnect structure. In general, the substrate 200 refers to any workpiece upon which film processing is performed, and a substrate structure 250 is used to generally denote the substrate 200 as well as other material layers formed on the substrate 200. Depending on the specific stage of processing, the substrate 200 may be a silicon semiconductor wafer, or other material layer, which has been formed on the wafer. FIG. 2a, for example, shows a cross-sectional view of a substrate structure 250, having a material layer 202 thereon.

In this particular illustration, the material layer 202 may be an oxide (e. g., silicon dioxide). The material layer 202 has been conventionally formed and patterned to provide a contact hole 202H extending to the top surface 200T of the substrate 200.

FIG. 2b shows a boride layer 204 conformably formed on the substrate structure 250. The boride layer 204 is formed by chemisorbing monolayers of a boron-containing compound and a refractory metal compound on the substrate structure 250.

The monolayers are chemisorbed by sequentially providing a boron-containing compound and one or more refractory metal compounds to a process chamber. In a first sequential chemisorption process, the monolayers of the boron-containing compound and one refractory metal compound are alternately chemisorbed on a substrate 300 as shown in FIGS. 3a–3c.

Figure 3A:
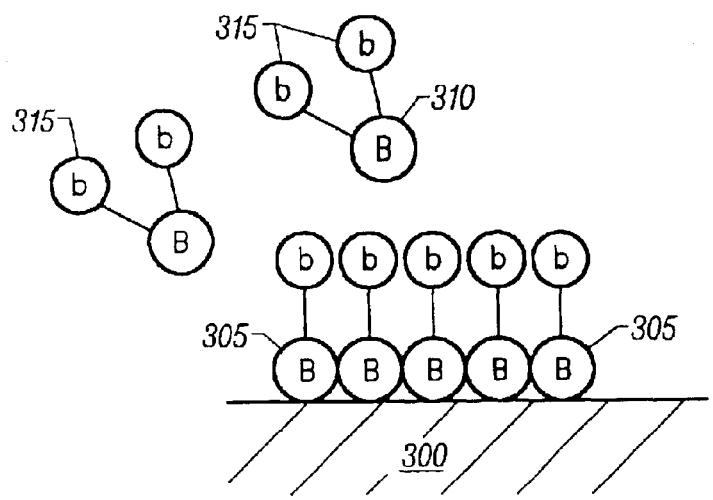
FIGS. 3a–3c depict cross-sectional views of a substrate undergoing a first sequential chemisorption process of a boron compound and one refractory metal compound to form a boride barrier layer.
Figure 3B:
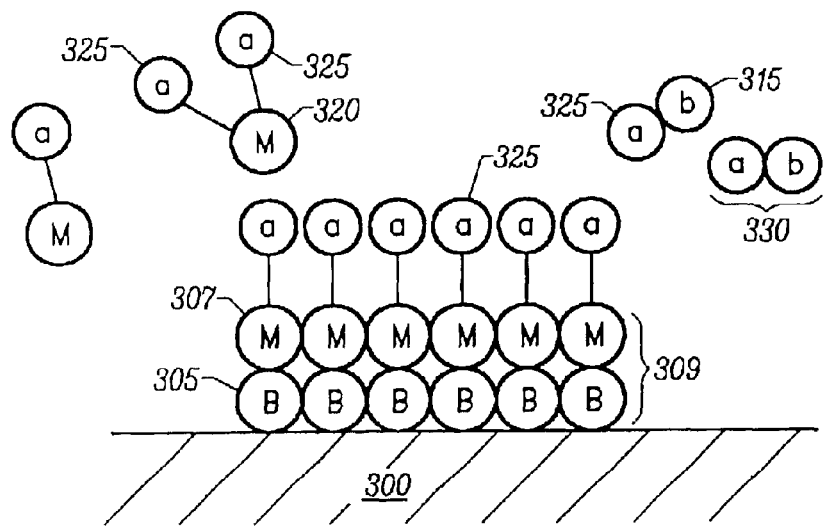
Figure 3C:
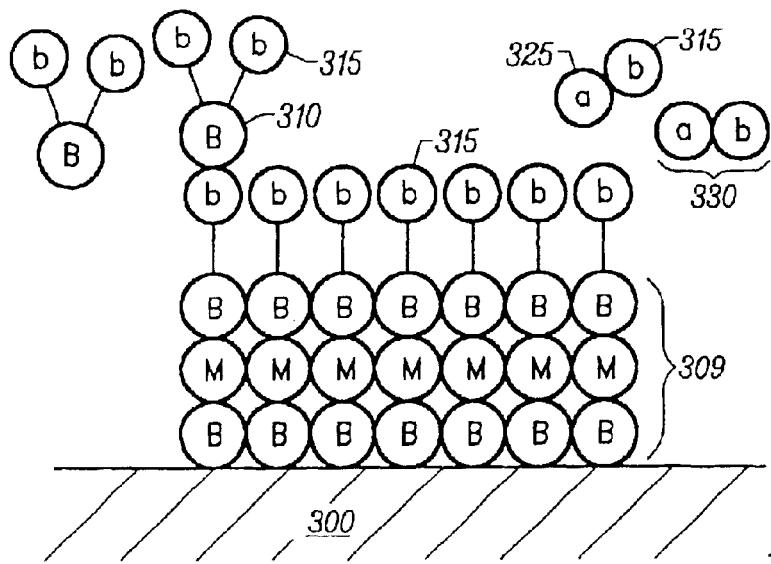

FIG. 3a depicts a cross-sectional view of a substrate 300, which may be in a stage of integrated circuit fabrication. A monolayer of a boron-containing compound 305 is chemisorbed on the substrate 300 by introducing a pulse of a boron-containing gas into a process chamber similar to that shown in FIG. 1. The boron-containing compound typically combines boron atoms 310 with one or more reactive species b 315. During boride layer formation, the reactive species b 315 form byproducts that are transported from the substrate 300 surface by the vacuum system.

The chemisorbed monolayer of the boron-containing compound 305 is self-limiting in that only one monolayer may be chemisorbed onto the substrate 300 surface during a given pulse. Only one monolayer of the boron-containing compound is chemisorbed on the substrate because the substrate has a limited surface area. This limited surface area provides a finite number of sites for chemisorbing the boron-containing compound. Once the finite number of sites are occupied by the boron-containing compound, further chemisorption of the boron-containing compound will be blocked.

The boron-containing compound may be for example a borane compound having the general formula $B_xH_y$, where x has a range between 1 and 10, and y has a range between 3 and 30. For example, borane ($BH_3$), diborane ($B_2H_6$), triborane, tetraborane, pentaborane, hexaborane, heptaborane, octaborane, nanaborane, and decaborane, may be used as the boron-containing compound.

After the monolayer of the boron compound is chemisorbed onto the substrate 300, excess boron-containing compound is removed from the process chamber by introducing a pulse of a purge gas thereto. Purge gases such as, for example helium (He), argon (Ar), nitrogen ($N_2$), ammonia ($NH_3$), and hydrogen ($H_2$), among others may be used.

After the process chamber has been purged, a pulse of one refractory metal compound is introduced into the process chamber. Referring to FIG. 3b, a layer of the refractory metal compound 307 is chemisorbed on the boron monolayer 305. The refractory metal compound typically combines refractory metal atoms 320 with one or more reactive species a 325.

The chemisorbed monolayer of the refractory metal compound 307 reacts with the boron-containing monolayer 305 to form a boride layer 309. The reactive species a 325 and b 315 form byproducts ab 330 that are transported from the substrate 300 surface by the vacuum system. The reaction of the refractory metal compound 307 with the boron monolayer 305 is self-limited, since only one monolayer of the boron compound was chemisorbed onto the substrate 300 surface.

The refractory metal compound may include refractory metals such as for example titanium (Ti), tungsten (W), tantalum (Ta), zirconium (Zr), hafnium (Hf), molybdenum (Mo), niobium (Nb), vanadium (V), and chromium (Cr), among others combined with reactive species such as, for example chlorine (Cl) and fluorine (F). For example, titanium tetrachloride ($TiCl_4$), tungsten hexafluoride ($WF_6$), tantalum pentachloride ($TaCl_5$), zirconium tetrachloride ($ZrCl_4$), hafnium tetrachloride ($HfCl_4$), molybdenum pentachloride ($MoCl_5$), niobium pentachloride ($NbCl_5$), vanadium pentachloride ($VCl_5$), chromium tetrachloride ($CrCl_4$) may be used as the refractory metal compound.

After the monolayer of the refractory metal compound is chemisorbed onto the substrate 300, any excess refractory metal compound is removed from the process chamber by introducing another pulse of the purge gas therein. Thereafter, as shown in FIG. 3c, the boride layer deposition sequence of alternating monolayers of the boron-containing compound and the refractory metal compound are repeated until a desired boride layer thickness is achieved. The boride layer may, for example, have a thickness in a range of about 200 Å to about 5000 Å, and more preferably, about 2500 Å.

In FIGS. 3a–3c, boride layer formation is depicted as starting with the chemisorption of a boron-containing monolayer on the substrate followed by a monolayer of a refractory metal compound. Alternatively, the boride layer formation may start with the chemisorption of a monolayer of a refractory metal compound on the substrate followed by a monolayer of the boron-containing compound.

The pulse time for each pulse of the boron-containing compound, the one or more refractory metal compounds, and the purge gas is variable and depends on the volume capacity of the deposition chamber as well as the vacuum system coupled thereto. Similarly, the time between each pulse is also variable and depends on the volume capacity of the process chamber as well as the vacuum system coupled thereto.

In general, the alternating monolayers may be chemisorbed at a substrate temperature less than about 500° C., and a chamber pressure less than about 100 torr. A pulse time of less than about 1 second for the boron-containing compound, and a pulse time of less than about 1 second for the refractory metal compounds are typically sufficient to chemisorb the alternating monolayers that comprise the boride layer on the substrate. A pulse time of less than about 1 second for the purge gas is typically sufficient to remove the reaction byproducts as well as any residual materials remaining in the process chamber.

Figure 4A:
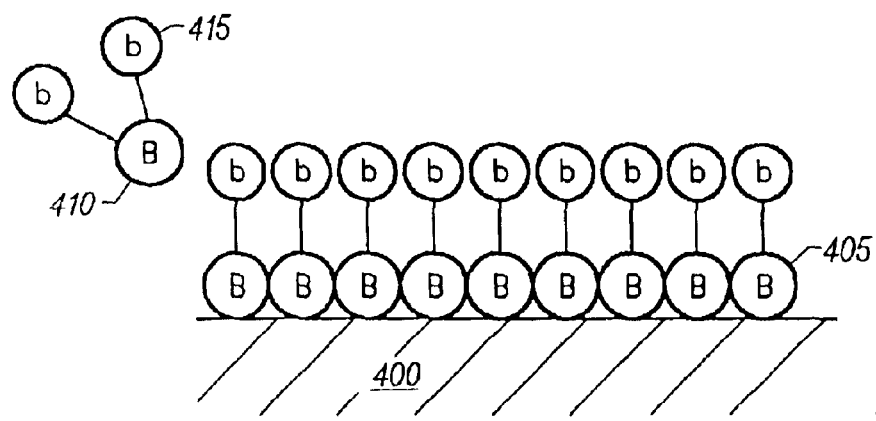
FIGS. 4a–4d depict cross-sectional views of a substrate undergoing a second sequential chemisorption process of a boron compound and two refractory metal compounds to form a composite boride barrier layer.

In a second chemisorption process, the boron-containing monolayers and two or more refractory metal compounds are alternately chemisorbed on the substrate to form a composite boride layer. FIG. 4a depicts a cross-sectional view of a substrate 400, which may be in a stage of integrated circuit fabrication. A self-limiting monolayer of a boron-containing compound 405 is chemisorbed on the substrate 400 by introducing a pulse of a boron-containing compound into a process chamber similar to that shown in FIG. 1 according to the process conditions described above with reference to FIGS. 2a–2c. The boron-containing compound combines boron atoms 410 with one or more reactive species b 415.

After the monolayer of the boron compound 405 is chemisorbed onto the substrate 400, excess boron-containing compound is removed from the process chamber by introducing a pulse of a purge gas thereto.

Figure 4B:
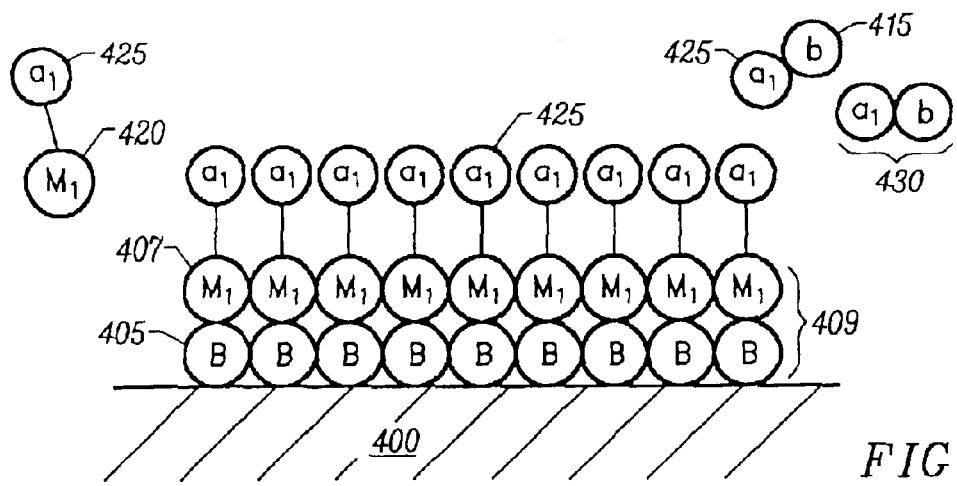

Referring to FIG. 4b, after the process chamber has been purged, a pulse of a first refractory metal compound $M_1a_1$ is introduced into the process chamber. A layer of the first refractory metal compound 407 is chemisorbed on the boron monolayer 405. The first refractory metal compound typically combines first refractory metal atoms $M_1$ 420 with one or more reactive species $a_1$ 425.

The chemisorbed monolayer of the first refractory metal compound 407 reacts with the boron-containing monolayer 405 to form a boride monolayer 409. The reactive species $a_1$ 425 and b 415 form byproducts $a_1b$ 430 that are transported from the substrate 400 surface by the vacuum system.

After the monolayer of the first refractory metal compound 407 is chemisorbed onto the substrate 400, the excess first refractory metal compound $M_1a_1$ is removed from the process chamber by introducing another pulse of the purge gas therein.

Figure 4C:
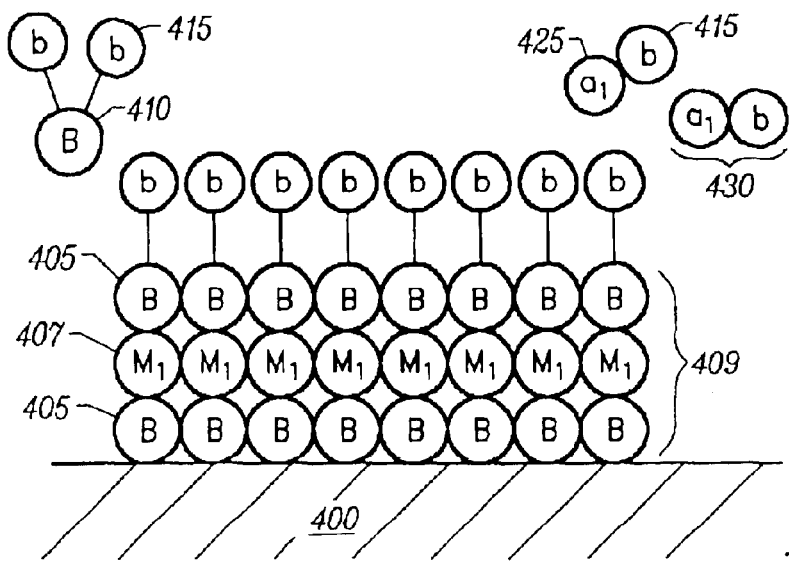

Another pulse of the boron-containing compound is than introduced into the process chamber. A monolayer of the boron-containing compound 405 is chemisorbed on the first refractory metal monolayer 407, as shown in FIG. 4c. The chemisorbed monolayer of the boron-containing compound 405 reacts with the first refractory metal monolayer 407 to form a boride layer 409. The reactive species $a_1$ 425 and b 415 form byproducts $a_1b$ 430 that are transported from the substrate 400 surface by the vacuum system.

After the monolayer of the boron compound 405 is chemisorbed onto the first refractive metal monolayer 407, excess boron-containing compound is removed from the process chamber by introducing a pulse of a purge gas thereto.

Figure 4D:
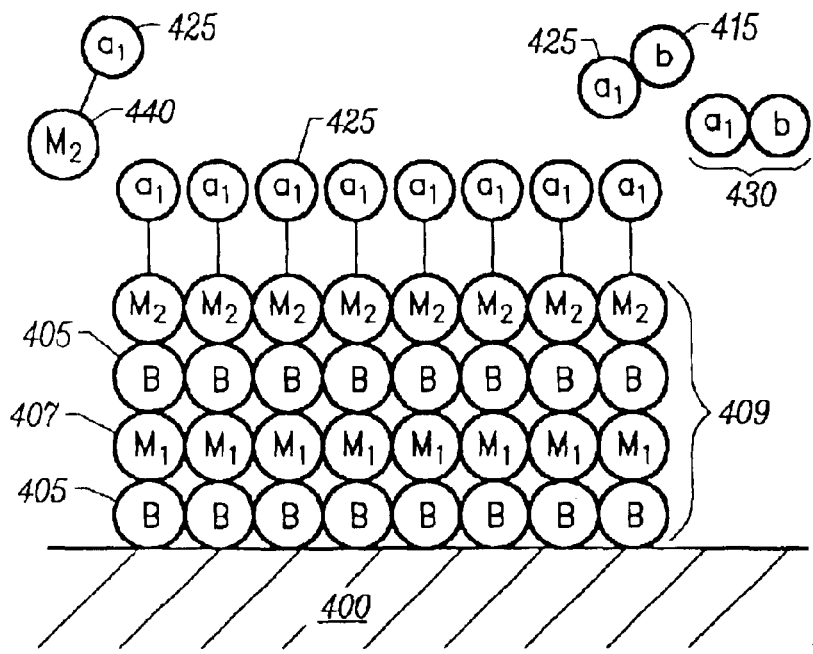

Referring to FIG. 4d, after the process chamber has been purged, a pulse of a second refractory metal compound $M_2a_1$ is introduced into the process chamber. A layer of the second refractory metal compound 411 is chemisorbed on the boron monolayer 405. The second refractory metal compound typically combines second refractory metal atoms $M_2$ 440 with one or more reactive species $a_1$ 425.

The chemisorbed monolayer of the second refractory metal compound 411 reacts with the boron-containing monolayer 405 to form the composite boride layer 409. The reactive species $a_1$ 425 and b 415 form byproducts $a_1b$ 430 that are transported from the substrate 400 surface by the vacuum system.

After the monolayer of the second refractory metal compound 411 is chemisorbed onto the substrate 400, the excess second refractory metal compound $M_2a_1$ is removed from the process chamber by introducing another pulse of the purge gas therein.

Thereafter, the boride layer deposition sequence of alternating monolayers of the boron-containing compound and the two refractory metal compounds $M_1a_1$ and $M_2a_1$ are repeated until a desired boride layer thickness is achieved.

In FIGS. 4a–4d, boride layer formation is depicted as starting with the chemisorption of the boron-containing monolayer on the substrate followed by monolayers of the two refractory metal compounds. Alternatively, the boride layer formation may start with the chemisorption of monolayers of either of the two refractory metal compounds on the substrate followed by monolayers of the boron-containing compound. Optionally, monolayers of more than two refractory metal compounds may be chemisorbed on the substrate 400.

In a third chemisorption process, the boron-containing monolayers and two or more refractory metal compounds are alternately chemisorbed on the substrate to form a composite boride layer, as illustrated in FIGS. 5a–5d.

Figure 5A:
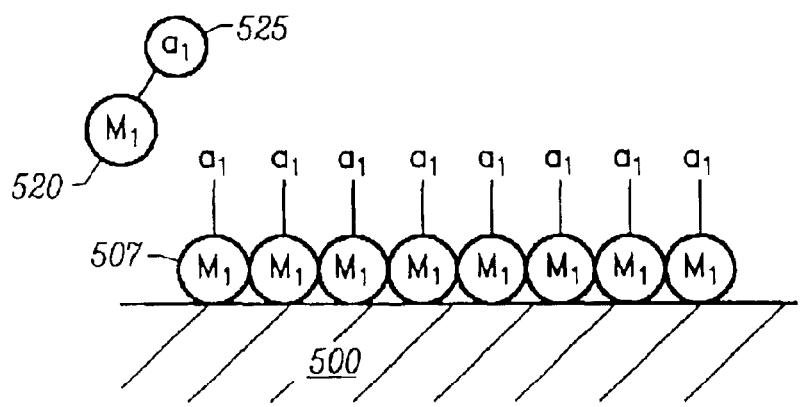
FIGS. 5a–5d depict cross-sectional views of a substrate undergoing a third sequential chemisorption of a boron compound and two refractory metal compounds to form a composite boride barrier layer.

FIG. 5a depicts a cross-sectional view of a substrate 500, which may be in a stage of integrated circuit fabrication. A self-limiting monolayer of a first refractory metal compound 507 is chemisorbed on the substrate 500 by introducing a pulse of a first refractory metal compound $M_1a_1$ into a process chamber similar to that shown in FIG. 1 according to the process conditions described above with reference to FIGS. 2a–2c.

After the monolayer of the first refractory metal compound 507 is chemisorbed onto the substrate 500, excess first refractory metal compound is removed from the process chamber by introducing a pulse of a purge gas thereto.

Figure 5B:
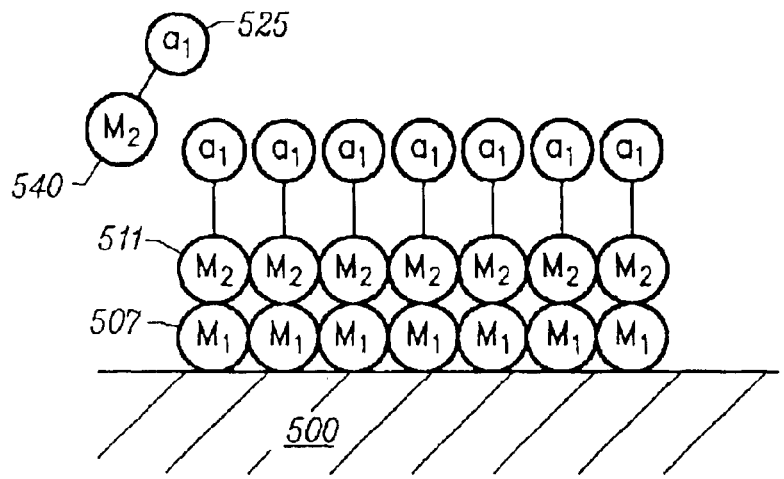

Referring to FIG. 5b, after the process chamber has been purged, a pulse of a second refractory metal compound $M_2a_1$ is introduced into the process chamber. A layer of the second refractory metal compound 511 is chemisorbed on the first refractory metal monolayer 507.

After the monolayer of the second refractory metal compound 511 is chemisorbed onto the substrate 500, the excess second refractory metal compound $M_2a_1$ is removed from the process chamber by introducing another pulse of the purge gas therein.

Figure 5C:
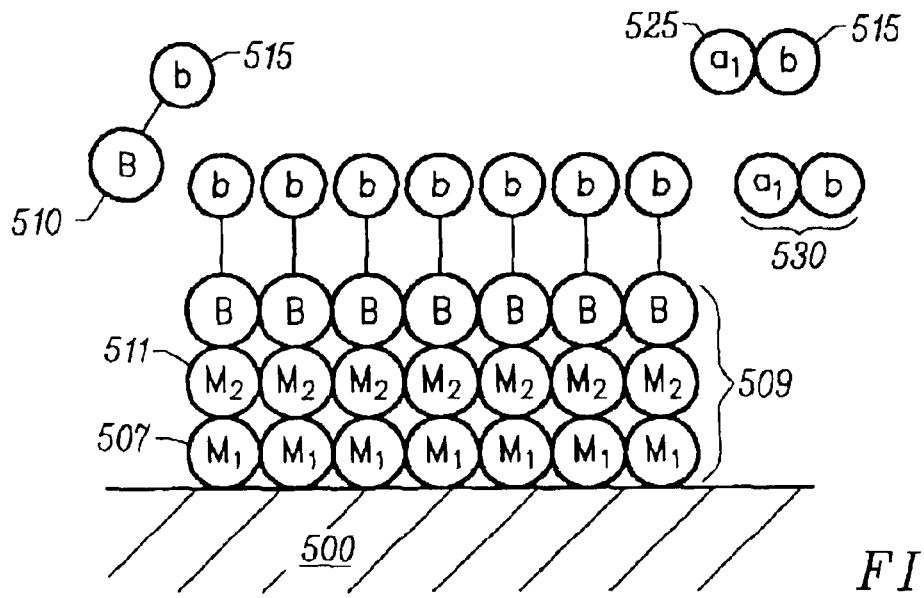

A pulse of a boron-containing compound is than introduced into the process chamber. A monolayer of the boron-containing compound 505 is chemisorbed on the second refractory metal monolayer 511, as shown in FIG. 5c. The chemisorbed monolayer of the boron-containing compound 505 reacts with the second refractory metal monolayer 511 to form a composite boride layer 509. The reactive species $a_1$ 525 and b 515 form byproducts $a_1$b 530 that are transported from the substrate 500 surface by the vacuum system.

After the monolayer of the boron compound 505 is chemisorbed onto the second refractory metal monolayer 511, excess boron-containing compound is removed from the process chamber by introducing a pulse of a purge gas thereto.

Figure 5D:
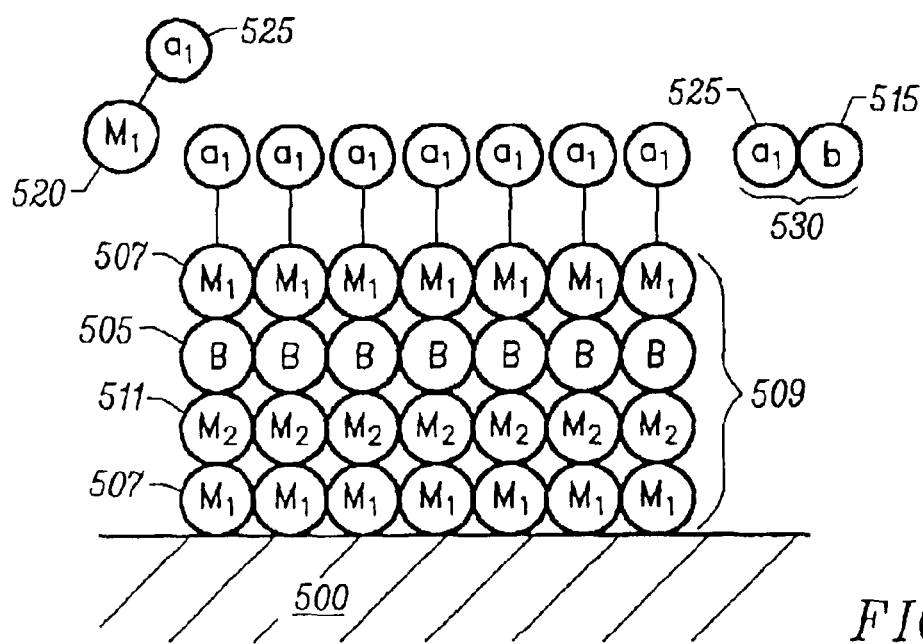

Referring to FIG. 5d, after the process chamber has been purged, a pulse of the first refractory metal compound $M_1a_1$ is introduced into the process chamber. A monolayer of the first refractory metal compound 507 is chemisorbed on the boron monolayer 505.

The chemisorbed monolayer of the first refractory metal compound 507 reacts with the boron-containing monolayer 505 to form the boride monolayer 509. The reactive species $a_1$ 525 and b 515 form byproducts $a_1$b 530 that are transported from the substrate 500 surface by the vacuum system.

After the monolayer of the first refractory metal compound 507 is chemisorbed onto the substrate 500, the excess first refractory metal compound $M_1a_1$ is removed from the process chamber by introducing another pulse of the purge gas therein.

Thereafter, the boride layer deposition sequence of alternating monolayers of the boron-containing compound and the two refractory metal compounds $M_1a_1$ and $M_2a_1$ are repeated until a desired boride layer thickness is achieved.

In FIGS. 5a–5d, boride layer formation is depicted as starting with the chemisorption of the first refractory metal monolayer on the substrate followed by monolayers of the second refractory metal compound and the boron-containing compound. Alternatively, the boride layer formation may start with the chemisorption of the monolayer of the boron-containing compound on the substrate followed by the monolayers of the two refractory metal compounds. Optionally, monolayers of more than two refractory metal compounds may be chemisorbed on the substrate 500.

The sequential deposition processes described above advantageously provide good step coverage for the boride layer, due to the monolayer chemisorption mechanism used for forming the boride layer. In particular, boride layer formation using the monolayer chemisorption mechanism is believed to contribute to a near perfect step coverage over complex substrate topographies.

Furthermore, in chemisorption processes, since only one monolayer may be absorbed on the topographic surface, the size of the deposition area is largely independent of the amount of precursor gas remaining in the reaction chamber once a monolayer has been formed.

Referring to FIG. 2c, after the formation of the boride layer 204, a contact layer 206 may be formed thereon to complete the interconnect structure. The contact layer 206 is preferably selected from the group of aluminum (Al), copper (Cu), tungsten (W), and combinations thereof.

The contact layer 206 may be formed, for example, using chemical vapor deposition (CVD), physical vapor deposition (PVD), or a combination of both CVD and PVD. For example, an aluminum (Al) layer may be deposited from a reaction of a gas mixture containing dimethyl aluminum hydride (DMAH) and hydrogen ($H_2$) or argon (Ar) or other DMAH containing compounds, a CVD copper layer may be deposited from a gas mixture containing $Cu^{+2}(hfac)_2$ (copper hexafluoro acetylacetonate), $Cu^{+2}(fod)_2$ (copper heptafluoro dimethyl octanediene), $Cu^{+1}$hfac TMVS (copper hexafluoro acetylacetonate trimethylvinylsilane), or combinations thereof, and a CVD tungsten layer may be deposited from a gas mixture containing tungsten hexafluoride ($WF_6$). A PVD layer is deposited from a copper target, an aluminum target, or a tungsten target.

Figure 6A:
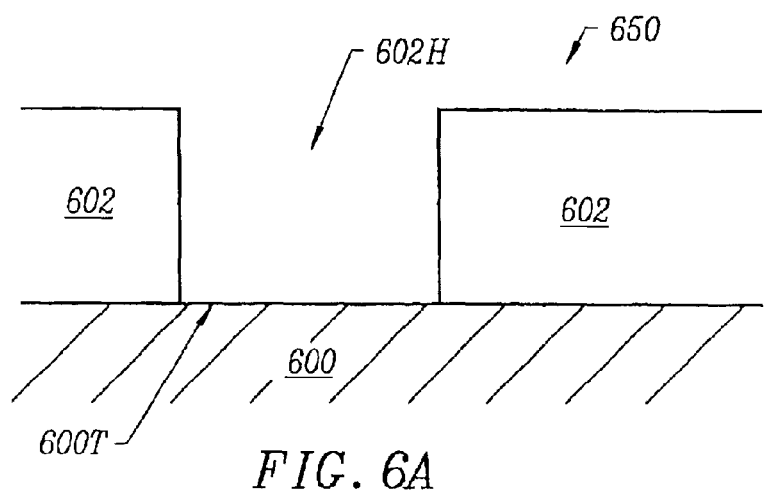
FIGS. 6a–6c depict cross-sectional views of a substrate structure at different stages of integrated circuit fabrication incorporating more than one boride barrier layer.
Figure 6B:
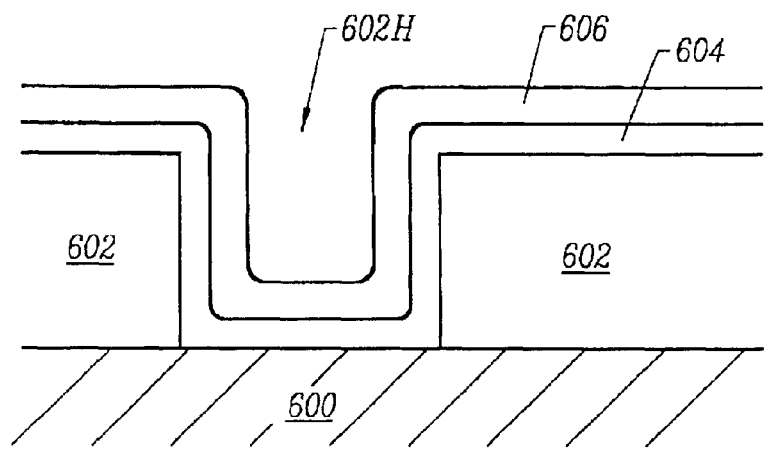
Figure 6C:
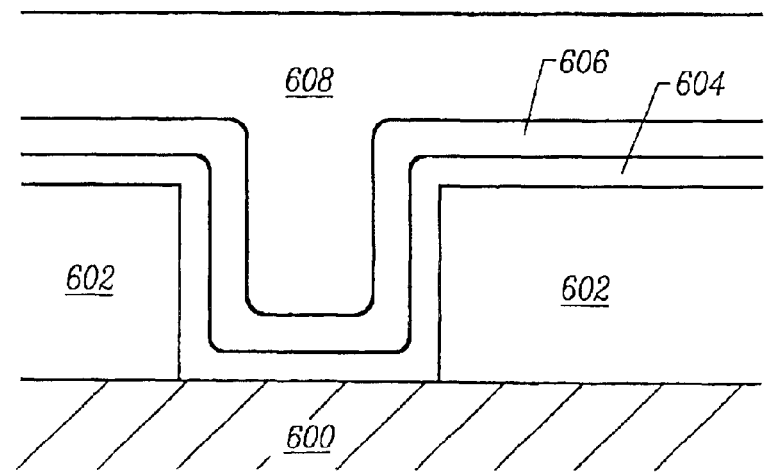

FIGS. 6a–6c illustrate an alternate embodiment of boride layer formation for integrated circuit fabrication of the interconnect structure. In general, the substrate 600 refers to any workpiece upon which film processing is performed, and a substrate structure 650 is used to generally denote the substrate 600 as well as other material layers formed on the substrate 600. Depending on the specific stage of processing, the substrate 600 may be a silicon semiconductor wafer, or other material layer, which has been formed on the wafer. FIG. 6a, for example, shows a cross-sectional view of a substrate structure 650, having a material layer 602 thereon. In this particular illustration, the material layer 602 may be an oxide (e. g., silicon dioxide). The material layer 602 has been conventionally formed and patterned to provide a contact hole 602H extending to the top surface 600T of the substrate 600.

FIG. 6b shows two boride layers 604, 606 conformably formed on the substrate structure 650. The boride layers 604, 606 are formed by chemisorbing monolayers of a boron-containing compound and one or more refractory metal compounds on the substrate structure 650 as described above with reference to FIGS. 3a–5d. The two boride layers 604, 606 may each comprise one or more refractory metals. The thicknesses of the two or more boride layers 604, 606 may be variable depending on the specific stage of processing. Each boride layer 604, 606 may, for example, have a thickness in a range of about 200 Å to about 5000 Å.

Referring to FIG. 6c, after the formation of the boride layers 604, 606, a contact layer 608 may be formed thereon to complete the interconnect structure. The contact layer 608 is preferably selected from the group of aluminum (Al), copper (Cu), tungsten (W), and combinations thereof.

The specific process conditions disclosed in the above discussion are meant for illustrative purposes only. Other combinations of process parameters such as precursor and inert gases, flow ranges, pressure and temperature may also be used in forming the boride layer of the present invention.

Although several preferred embodiments, which incorporate the teachings of the present invention, have been shown and described in detail, those skilled in the art can readily devise many other varied embodiments that still incorporate these teachings.

What is claimed is:

1. A method of forming a film on a substrate, comprising:
   positioning the substrate having an oxide layer thereon; and
   forming at least one metal boride layer on at least a portion of the substrate by sequentially chemisorbing monolayers of a boron-containing compound and one or more refractory metal compounds on the substrate to form the at least one metal boride layer thereon, wherein the at least one metal boride layer is formed using a sequential chemisorption process.

2. The method of claim 1, wherein the substrate is subjected to a purge gas following chemisorption of each monolayer.

3. The method of claim 1, wherein the boron-containing compound has general formula $B_xH_y$, where x has a range between 1 and 10, and y has a range between 3 and 30.

4. The method of claim 3, wherein the boron-containing compound is selected from the group consisting of borane, diborane, triborane, tetraborane, pentaborane, hexaborane, heptaborane, octaborane, nonaborane and decaborane.

5. The method of claim 1, wherein the one or more refractory metal compounds are selected from the group consisting of titanium tetrachloride, tungsten hexafluoride, tantalum pentachloride, zirconium tatrachloride, hafnium tetrachloride, molybdenum pentachloride, niobium pentachloride, vanadium chloride, and chromium chloride.

6. The method of claim 1, wherein forming at least one metal boride layer is performed at a temperature less than about 500° C.

7. The method of claim 1, wherein forming at least one metal boride layer is performed at a pressure less than about 100 Torr.

8. The method of claim 2, wherein the purge gas is selected from the group of helium, argon, hydrogen, nitrogen, ammonia, and combinations thereof.

9. The method of claim 1, wherein monolayers of the boron-containing compound and the one or more refractory metal compounds are alternately chemisorbed on the substrate.

10. The method of claim 9, wherein one monolayer of the boron-containing compound is chemisorbed between each chemisorbed monolayer of the one or more refractory metal compounds.

11. The method of claim 9, wherein one monolayer of the boron-containing compound is chemisorbed on the substrate after two or more monolayers of the one or more refractory metal compounds are chemisorbed thereon.

12. The method of claim 1, wherein the at least one metal boride layer has a thickness less than about 100 Å.

13. The method of claim 1, wherein the at least one metal boride layer has a thickness in a range of from about 200 Å to about 5,000 Å.

14. A method of forming a layer on a substrate for use in integrated circuit fabrication, comprising:
   positioning the substrate within a deposition chamber; and
   forming a boride layer comprising tungsten on at least a portion of the substrate by sequentially chemisorbing monolayers of a boron-containing compound and a tungsten-containing compound on the substrate.

15. A method of film deposition for integrated circuit fabrication, comprising:
   placing a substrate within a deposition chamber;
   introducing a boron-containing compound into the chamber;
   chemisorbing at least a portion of the boron-containing compound on the substrate at conditions sufficient to form a boron-containing layer;
   evacuating the chamber;
   introducing at least one refractory metal compound into the chamber;
   reacting a portion of the at least one refractory metal compound with the boron-containing layer at conditions sufficient to form a metal boride containing layer; and
   evacuating the chamber.

16. The method of claim 15, wherein the metal boride containing layer comprises at least one refractory metal selected from the group consisting of titanium, tungsten, vanadium, niobium, tantalum, zirconium, hafnium, chromium and molybdenum.

17. The method of claim 15, wherein the at least one refractory metal compound is selected from the group consisting of titanium tetrachloride tungsten hexafluoride, tantalum pentachloride, zirconium tetrachloride, hafnium tetrachloride molybdenum pentachloride, niobium pentachloride, vanadium chloride and chromium chloride.

18. The method of claim 15, wherein the boron-containing compound has the general formula $B_xH_y$, where x has a range from 1 to 10 and y has a range from 3 to 30.

19. The method of claim 15, wherein the boron-containing compound is selected from the group consisting of borane, diborane, triborane, tetraborane, pentaborane, hexaborane, heptaborane, octaborane, nonaborane and decaborane.

20. The method of claim 15, wherein the conditions sufficient to form the metal boride containing layer comprises a temperature of about 500° C. or less.

21. The method of claim 15, wherein the conditions sufficient to form the metal boride containing layer comprises a pressure of about 100 Torr or less.

22. The method of claim 15, further comprising purging the deposition chamber with at least one purge gas selected from the group consisting of helium, argon, hydrogen, nitrogen, ammonia and combinations thereof.

23. The method of claim 15, wherein the metal boride containing layer comprises at least two refractory metals.

24. The method of claim 15, wherein the metal boride containing layer has a thickness from about 200 Å to about 5,000 Å.

25. A method of film deposition for integrated circuit fabrication, comprising:
   placing a substrate within a deposition chamber;
   introducing at least one refractory metal compound into the chamber;
   chemisorbing a portion of the at least one refractory metal compound on the substrate to form refractory metal containing layer;
   evacuating the chamber;
   introducing a boron-containing compound into the chamber;
   reacting at least a portion of the boron-containing compound with the refractory metal containing layer at conditions sufficient to form a metal boride containing layer; and
   evacuating the chamber.

26. The method of claim 25, wherein the metal boride containing layer comprises at least one refractory metal selected from the group consisting of titanium, tungsten, vanadium, niobium, tantalum, zirconium, hafnium, chromium and molybdenum.

27. The method of claim 25, wherein the at least one refractory metal compound is selected from the group consisting of titanium tetrachloride, tungsten hexafluoride, tantalum pentachloride, zirconium tetrachloride, hafnium tetrachloride, molybdenum pentachloride, niobium pentachloride, vanadium chloride and chromium chloride.

28. The method of claim 25, wherein the boron-containing compound has the general formula $B_xH_y$, where x has a range from 1 to 10, and y has a range from 3 to 30.

29. The method of claim 25, wherein the boron-containing compound is selected from the group consisting of borane, diborane, triborane, tetraborane, pentaborane, hexaborane, heptaborane, octaborane, nonaborane and decaborane.

30. The method of claim 25, wherein the conditions sufficient to from the metal boride containing layer comprises a temperature of about 500° C. or less.

31. The method of claim 25, wherein the conditions sufficient to form the metal boride containing layer comprises a pressure of about 100 Torr or less.

32. The method of claim 25, further comprising purging the deposition chamber with at least one purge gas selected from the group consisting of helium, argon, hydrogen, nitrogen, ammonia and combinations thereof.

33. The method of claim 25, wherein the metal boride containing layer comprises at least two refractory metals.

34. The method of claim 25, wherein the metal boride containing layer has a thickness from about 200 Å to about 5,000 Å.

* * * * *